United States Patent
Ajmera et al.

[11] Patent Number: 6,013,583
[45] Date of Patent: *Jan. 11, 2000

[54] LOW TEMPERATURE BPSG DEPOSITION PROCESS

[75] Inventors: Atul C. Ajmera, Wappingers Falls, N.Y.; Jeffrey Peter Gambino, Gaylordsville, Conn.; Son Van Nguyen, Hopewell Junction, N.Y.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/671,021

[22] Filed: Jun. 25, 1996

[51] Int. Cl.$^7$ .......................... H01L 21/31; H01L 21/469

[52] U.S. Cl. .......................... 438/783; 438/787; 438/790

[58] Field of Search .......................... 438/783, 784, 438/795, 760, 761, 787, 790; 148/DIG. 133

[56] References Cited

U.S. PATENT DOCUMENTS

| | | | |
|---|---|---|---|
| 3,447,958 | 6/1969 | Okutsu et al. | 438/761 |
| 4,371,587 | 2/1983 | Peters | 428/446 |
| 4,413,022 | 11/1983 | Suntola et al. | 427/255 |
| 4,683,144 | 7/1987 | Nishimura et al. | 427/35 |
| 4,835,597 | 5/1989 | Okuyama et al. | 357/52 |
| 5,094,984 | 3/1992 | Liu et al. | 437/235 |
| 5,104,482 | 4/1992 | Monkowski et al. | 438/784 |
| 5,166,101 | 11/1992 | Lee et al. | 438/784 |
| 5,225,378 | 7/1993 | Ushikawa | 437/233 |
| 5,231,058 | 7/1993 | Maeda et al. | 437/235 |
| 5,296,400 | 3/1994 | Park et al. | 437/52 |
| 5,314,724 | 5/1994 | Tsukune et al. | 427/489 |
| 5,372,958 | 12/1994 | Miyasaka et al. | 438/795 |
| 5,387,546 | 2/1995 | Maeda et al. | 437/174 |
| 5,405,489 | 4/1995 | Kim et al. | 438/760 |
| 5,405,802 | 4/1995 | Yamagata et al. | 437/71 |
| 5,409,743 | 4/1995 | Bouffard et al. | 427/579 |
| 5,409,858 | 4/1995 | Thakur et al. | 437/173 |

FOREIGN PATENT DOCUMENTS

0677869A1  10/1995  European Pat. Off. .... H01L 21/3105

OTHER PUBLICATIONS

The Anisotropic Deposition of Doped Silicate Glass; Uram, et al.,; Lam Research Corp.; J. Electrochem. Soc., vol. 140, No. 12, Dec. 1993.

Nguyen, et al. "Boron Phosphorous Silicon Glass Insulator for Sub–Half Micron Trench Fill," Electrochemical Society extended abstract #251, Spring 1994, pp. 406–407.

Matsuura, et al. "Novel Self–Planarizing CVD Oxide for Interlayer Dielectric Applications," IEDM Technical Digest, 1994, pp. 117–120.

C. Dobson, et al., Advanced SiO2 Planarization Using Silane and H2O2, *Semiconductor International,* Dec. 1994, vol. 17, No. 14, pp. 85–86, 88 XP000671223.

*Patent Abstracts of Japan,* vol. 018, No. 035 (E–1494), Jan. 19, 1994 & JP 05 267480 A (Ricoh Co Ltd), Oct. 15, 1993, abstract.

*Patent Abstracts of Japan,* vol. 015, No. 058 (E–1032), Feb. 12 1991 & JP 02 284425 A (NEC Corp), Nov. 21, 1990, abstract.

*Primary Examiner*—Deborah Jones
*Assistant Examiner*—Cathy F. Lam
*Attorney, Agent, or Firm*—Schmeiser, Olsen & Watts

[57] ABSTRACT

A process for the low temperature deposition of a thin film of borophosphosilicate glass ("BPSG") for use in semiconductor devices, such as DRAMs, is disclosed. The process includes utilizing R—OH groups as reagents to provide additional —OH groups so that an intermediate $\{Si(OH)_4\}_n$ is formed having superior reflow properties so that the annealing and reflow steps may occur at temperatures less than 750° C., which is the current processing temperature.

16 Claims, 2 Drawing Sheets

TYPICAL GATE CONDUCTOR STRUCTURE TO BE FILLED WITH BPSG FILM.

TYPICAL GATE CONDUCTOR STRUCTURE TO BE FILLED WITH BPSG FILM.

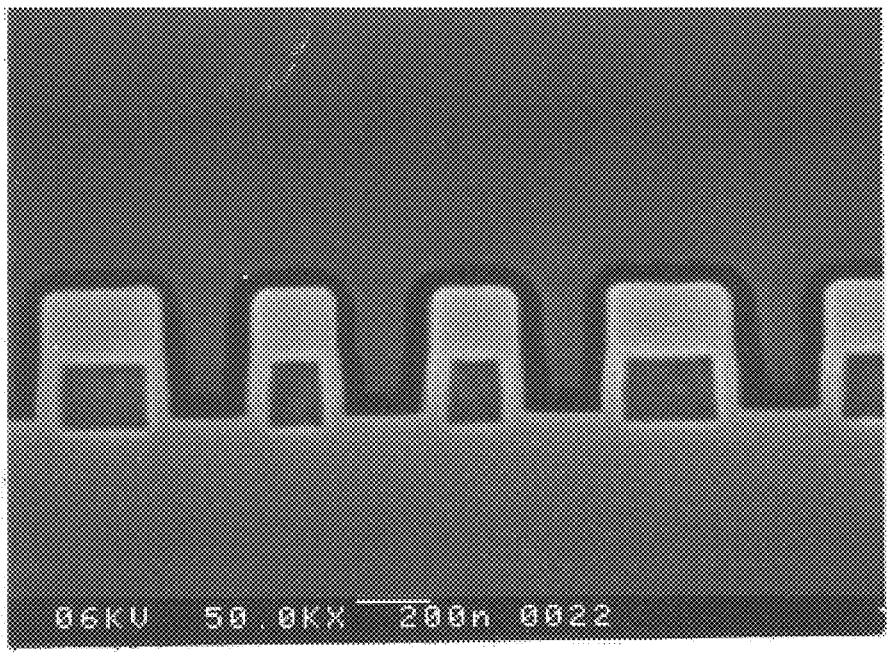
FIG.2A
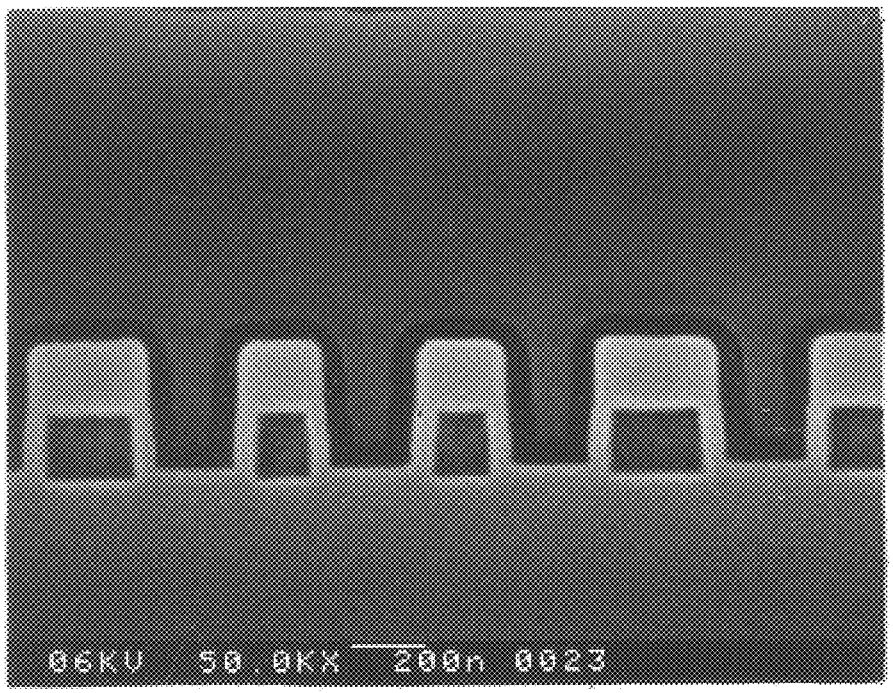
FIG.2B
A TYPICAL GATE CONDUCTOR STRUCTURE SUB-HALF
MICRON FILLED WITH BPSG FILM AT <750°C.
FIG.2

LOW TEMPERATURE BPSG DEPOSITION PROCESS

BACKGROUND OF THE INVENTION

1. Technical Field

This invention generally relates to a method for fabricating semiconductors, and more particularly, a method for achieving low temperature reflow of borophosphosilicate glass ("BPSG") both during deposition and subsequent annealing.

2. Background Art

In recent years, progress in the miniaturization and multilayer interconnection of semiconductor devices has led to an increase in the aspect ratio, with the result that uneven portions on the surface of a pattern have a serious influence on the reliability of the device. For this reason, the development of a process or material for the formation of a semiconductor device which enables better planarizing of an interlayer insulation film provided between wiring layers has been a driving force behind much research.

Borophosphosilicate glass ("BPSG") films or layers exhibit good planarizing properties and are therefore especially important in highly dense dynamic random access memories ("DRAMs"), especially in advanced DRAMs having increased stacked capacitor heights and ultra high integration densities. Typically, however, BPSG reflow or annealing requires high temperature processes, which cause device breakdown because of thermal stress and unwanted dopant diffusion. Additionally, the high temperatures may be detrimental to the advanced silicides currently used for ultra large scale integrated circuits ("ULSI"), such as cobalt silicide, titanium silicide, and nickel silicide.

In order to deal with these problems, related art methods of improving the deposition temperature have included increasing the annealing time and doping the films with germanium (Ge) to reduce the processing temperature to approximately 700° C. However, Ge doping requires a longer process time, therefore decreasing production, and results in lower film quality, which in turn renders it incompatible with current ULSI processing.

It has been shown in more recent studies that the reflow properties of oxide films can be enhanced by reacting silane with peroxide at a temperature in the range of 0–50° C. as follows:

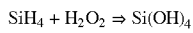

$$SiH_4 + H_2O_2 \Rightarrow Si(OH)_4$$

The reflow polymerized siloxane formed yields good gap filling of the interlevel metals. However, the as-deposited film is of poor quality and must be made more dense by high temperature annealing. Furthermore, the processing time is generally longer when compared to other processes. This process can only be implemented at low temperatures (0–50° C.) because $H_2O_2$ decomposes rapidly at higher temperatures. As a result, the deposition can only be implemented in multi-step processes and with lower quality films. Additionally, the process has only been developed for undoped oxides. However, boron and/or phosphorus doped oxides are required in many applications for mobile ion gettering and to allow high etch rates during contact hole etching. Incorporation of higher concentrations (>5 wt %) of boron and phosphorus dopants may increase crystal defect formation on the deposited film. This will subsequently have a detrimental effect on ULSI and VLSI device fabrication.

BRIEF DESCRIPTION OF THE DRAWINGS

The preferred exemplary embodiment of the present invention will hereinafter be described in conjunction with the appended drawings, where like designations denote like elements, and:

FIG. 2A is a first SEM of the typical gate conductor structure with the present invention; and FIG. 2B is a second SEM of the typical gate conductor structure with the present invention.

DISCLOSURE OF THE INVENTION

Figure 1:
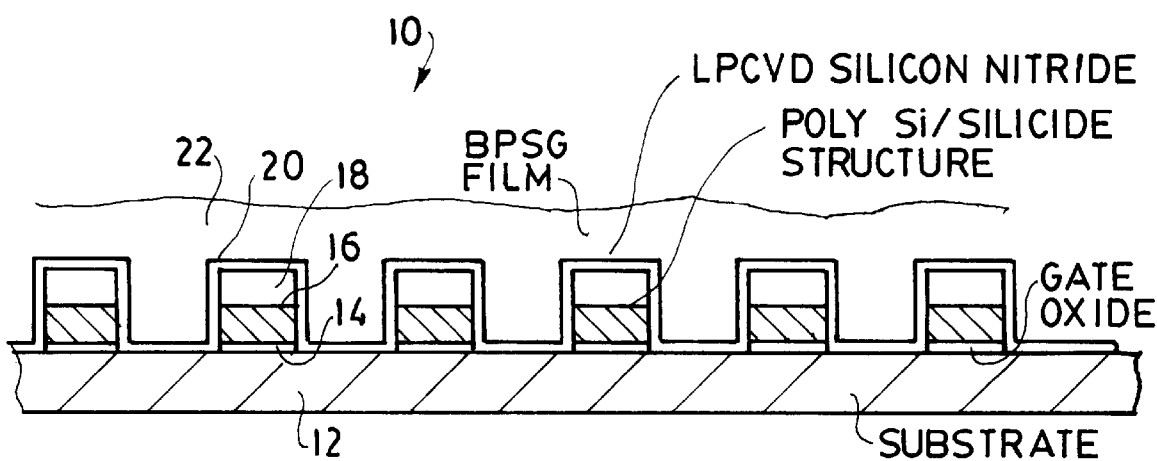
FIG. 1 is a diagrammatic cross-sectional view of of the present invention.

According to the present invention, hydroxyl groups are introduced to the BPSG chemical vapor deposition ("CVD") system to achieve low temperature reflow, both during deposition and during the subsequent annealing steps. The process consists of: depositing a thin BPSG film onto a surface; in situ annealing the film; and depositing a final thin layer of BPSG film.

It is an advantage of the present invention that properties of good gap fill, high planarization capability, and the ability to getter mobile ions such as potassium and sodium are maintained without additional processing steps.

It is a feature of the present invention that the processing temperature of BPSG films is reduced below current process temperatures of 750–850° C., therefore rendering the process suitable for the advanced silicides used in ULSI. This process utilizes the advantages of hydroxyl groups that are more stable than $H_2O_2$ to enable processing at higher temperatures (>50° C.) but still low enough temperatures (<700° C.) for advanced silicide applications.

It is another feature of the present invention that unwanted dopant diffusion and thermal stress are reduced by the lower temperature processing.

As an additional advantage, it is preferable to also reduce the amount of steps and/or time it takes to process the silicide film so that throughput rates are optimized. By utilizing a simple, three step process, the present invention reduces the time necessary to process the silicide layer while filling the sub-0.25 μm gaps and voiding while still partially planarizing the surface.

The foregoing and other objects, features and advantages of the invention will be apparent from the following more particular description of preferred embodiments of the invention.

BEST MODE FOR CARRYING OUT THE INVENTION

A low pressure, relatively low temperature, chemical vapor deposition process is therefore disclosed. This process is conducted in an Integrity tool by LAM, Inc. of Freemont, Calif. and results in the filling of the sub-0.25 μm voids and partial planarization of the surface. The process comprises the steps of: deposition of a thin film of BPSG in accordance with the materials of the present invention; an in situ anneal step at 600–700° C. for 1–60 min.; and deposition of a final thin film of BPSG in accordance with the materials of the present invention.

The thin film of BPSG is deposited onto a surface that includes gate conductor structures of sub-half micron topography as shown in FIG. 1. The structure 10 includes a gate oxide layer 14, a polysilicon/silicate layer 16, a silicon nitride layer 18 and a thin film layer 20. The BPSG layer 22 is deposited on the surface of all of these layers. The final structure is shown in the scanning electron micrographs as shown in FIGS. 2A and 2B.

The reactants used to form the BPSG film according to the present invention are: silicon; oxygen; phosphorus; boron and R—OH, wherein R is selected from the group consisting of: H and any organic groups, such as alkyl, alkenyl, or benzyl groups. This group can be varied to increase or decrease the stability of the —OH groups depending on process conditions. Further, carbon chains of 1–10 carbons in length are preferred, however, longer chains may be used provided process parameters are manipulated to allow these carbon chains to be added to the silicone oxide.

The silicon is typically provided as tetraethylorthosilicate ("TEOS"), silane ($SiH_4$), or a mixture of the two. The phosphorus is provided as phosphine ($PH_3$), although alternative sources such as trimethyl phosphate ("TMP") or triethyl phosphate ("TEP") may also be used to reduce toxicity and reactivity. Oxygen is provided in the form of oxygen gas in its normal ($O_2$) state, although nitrous oxide or ozone may also be used. The boron is preferably provided as triethyl borate ("TEB"), however, diborane and trimethyl borate ("TMB") may also be used. Additionally, R—OH compounds are used to enhance the reflow and reduce the temperature at which the deposition and reflow or annealing steps take place. Therefore, the deposition reactions are as follows:

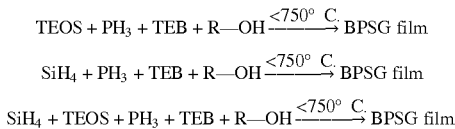

wherein R is H, $CH_3$, $C_2H_5$, $C_6H_5$, or any other alkyl or alkenyl organic compound.

It should be noted that, because the deposition of the BPSG film is conducted at a relatively high temperature (>500° C.), most R—OH species will be dissociated into the R group and the hydroxide group. Thus, the introduction of the R—OH groups to the reaction mixture generates more —OH groups during the deposition annealing and final planarization deposition. The hydroxide groups will then react with the silicon in either the silane or the TEOS and form mobile $\{Si(OH)_4\}_n$ groups, which in turn enhance the reflow properties of the film. As a result, the gap-filling properties of the process at lower processing temperatures as good as current processing methods (without the hydroxyl groups) at higher temperatures are observed, as shown in FIGS. 2A and 2B.

While the invention has been particularly shown and described with reference to preferred exemplary embodiments thereof, it will be understood by those skilled in the art that the foregoing and other changes in form and details may be made therein without departing from the spirit and scope of the invention.

We claim:

1. A process comprising the steps of:
   a) depositing an initial thin film of doped silicon oxide onto a semiconductor structure at a temperature of less than 750° C.;
   b) annealing the initial thin film of doped silicon oxide in situ; and
   c) depositing a final thin film of doped silicon oxide onto the initial thin film at a temperature of less than 750° C., wherein highly conforming insulation material is formed over the semiconductor structure.

2. The process of claim 1, wherein said depositing an initial thin film of doped silicon oxide comprises reacting a silicon source; a boron source; a phosphorus source; an oxygen source; and a hydroxide source.

3. The process of claim 2, wherein the silicon source is selected from the group consisting of: silane and tetraethylorthosilicate.

4. The process of claim 2, wherein the hydroxide source is R—OH, wherein R is selected from the group consisting of H; an alkyl group; a benzyl group; and an alkenyl group.

5. The process of claim 1, wherein the annealing occurs at a temperature less than or equal to 700° C. for 1 to 60 minutes.

6. The process of claim 1, wherein the highly conformal insulation material substantially fills sub-0.25 $\mu$m gaps and voids.

7. A process comprising the steps of:
   a) depositing a film of doped silicon oxide onto a semiconductor structure at a temperature of less than 750° C. by reacting a hydroxide source, a silicon source, a boron source, a phosphorus source, and an oxygen source; and
   b) annealing the film of doped silicon oxide in situ, wherein highly conforming insulation material is formed over the semiconductor structure.

8. The process of claim 7, wherein the annealing occurs at a temperature less than or equal to 700° C. for 1 to 60 minutes.

9. The process of claim 7, wherein the silicon source is selected from the group consisting of: silane and tetraethylorthosilicate.

10. The process of claim 7, wherein the hydroxide source is R—OH, wherein R is selected from the group consisting of H, an alkyl group, a benzyl group, and an alkenyl group.

11. The process of claim 7, wherein the highly conformal insulation material substantially fills sub-0.25 $\mu$m gaps and voids.

12. A process comprising the steps of:
   a) depositing an initial thin film of doped silicon oxide onto a semiconductor structure at a temperature of less than 750° C. by reacting a hydroxide source, a silicon source, a boron source, a phosphorus source, and an oxygen source;
   b) annealing the initial thin film of doped silicon oxide in situ; and
   c) depositing a final thin film of doped silicon oxide onto the initial thin film at a temperature of less than 750° C., wherein highly conforming insulation material is formed over the semiconductor structure.

13. The process of claim 12, wherein the annealing occurs at a temperature less than or equal to 700° C. for 1 to 60 minutes.

14. The process of claim 12, wherein the silicon source is selected from the group consisting of: silane and tetraethylorthosilicate.

15. The process of claim 12, wherein the hydroxide source is R—OH, wherein R is selected from the group consisting of H, an alkyl group, a benzyl group, and an alkenyl group.

16. The process of claim 12, wherein the highly conformal insulation material substantially fills sub-0.25 $\mu$m gaps and voids.

* * * * *